US009537237B2

(12) United States Patent
Brandon et al.

(10) Patent No.: US 9,537,237 B2
(45) Date of Patent: Jan. 3, 2017

(54) SYSTEM TO IMPROVE AN IN-LINE MEMORY MODULE

(71) Applicant: International Business Machines Corporation, Armonk, NY (US)

(72) Inventors: Mark A. Brandon, Poughkeepsie, NY (US); Shawn Canfield, Poughkeepsie, NY (US); David L. Edwards, Poughkeepsie, NY (US); Robert R. Genest, Poughkeepsie, NY (US); Randall G. Kemink, Poughkeepsie, NY (US); Robert K. Mullady, Highland, NY (US); John G. Torok, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 239 days.

(21) Appl. No.: 14/106,824

(22) Filed: Dec. 15, 2013

(65) Prior Publication Data

US 2014/0098482 A1    Apr. 10, 2014

Related U.S. Application Data

(62) Division of application No. 13/452,848, filed on Apr. 21, 2012, which is a division of application No. 12/566,591, filed on Sep. 24, 2009, now Pat. No. 8,248,805.

(51) Int. Cl.
*H01R 12/70* (2011.01)
*H01L 23/36* (2006.01)
*H05K 7/20* (2006.01)
*H05K 1/02* (2006.01)
*H01R 12/72* (2011.01)

(52) U.S. Cl.
CPC ........ *H01R 12/7029* (2013.01); *H01R 12/721* (2013.01); *H05K 1/0203* (2013.01); *H05K 7/20418* (2013.01); *H05K 7/20509* (2013.01); *H05K 2201/10159* (2013.01)

(58) Field of Classification Search
CPC .............. H01R 12/7029; H01R 12/721; H05K 2201/10159; H05K 7/20509; H05K 7/20418; H05K 1/0203
USPC ......... 257/707, 719; 361/702, 707, 709–711, 361/715, 719, 720, 679.31, 679.54
See application file for complete search history.

(56) References Cited

U.S. PATENT DOCUMENTS

| 727,996 A | 5/1903 | Parke | |
|---|---|---|---|
| 4,850,891 A * | 7/1989 | Walkup | .................... G11C 5/04 439/326 |
| 4,887,188 A * | 12/1989 | Yoshida | ............. G06K 13/0806 361/679.31 |

(Continued)

*Primary Examiner* — Anatoly Vortman
(74) *Attorney, Agent, or Firm* — Margaret A. McNamara; Ido Tuchman

(57) ABSTRACT

A system to improve an in-line memory module may include an edging carried by the in-line memory module to stiffen, support, protect, and/or aid in handling the in-line memory module. The system may also include guide ribs carried by the edging to facilitate positioning of the in-line memory module during installation. In one embodiment, the system includes a heat spreader to aid in cooling a plurality of heat sources carried by the in-line memory module. The system may further include a compliant member to regulate the heat spreader's positioning relative to the plurality of heat sources.

7 Claims, 4 Drawing Sheets

(56) References Cited

U.S. PATENT DOCUMENTS

| | | | | |
|---|---|---|---|---|
| 5,036,384 A | | 7/1991 | Umezawa | 357/82 |
| 5,162,979 A | * | 11/1992 | Anzelone | G06F 13/409 |
| | | | | 361/379.32 |
| 5,398,164 A | | 3/1995 | Goodman et al. | 361/752 |
| 5,623,394 A | | 4/1997 | Sherif et al. | 361/705 |
| 5,646,826 A | | 7/1997 | Katchmar | 361/704 |
| 5,661,339 A | * | 8/1997 | Clayton | H01L 23/13 |
| | | | | 257/668 |
| 5,708,297 A | * | 1/1998 | Clayton | H01L 23/13 |
| | | | | 257/712 |
| 5,710,693 A | | 1/1998 | Tsukada et al. | 361/679.32 |
| 5,757,620 A | | 5/1998 | Edwards et al. | 361/705 |
| 5,889,656 A | * | 3/1999 | Yin | H01R 12/7005 |
| | | | | 361/740 |
| 5,896,274 A | | 4/1999 | Ishida | 361/737 |
| 6,007,357 A | * | 12/1999 | Perino | H01R 12/7005 |
| | | | | 439/327 |
| 6,056,579 A | * | 5/2000 | Richards, III | H01R 12/7005 |
| | | | | 439/327 |
| 6,119,765 A | | 9/2000 | Lee | 165/80.3 |
| 6,130,817 A | * | 10/2000 | Flotho | G06F 1/187 |
| | | | | 248/200 |
| 6,176,727 B1 | * | 1/2001 | Liu | H01R 12/7005 |
| | | | | 439/327 |
| 6,178,624 B1 | | 1/2001 | Magette | 29/832 |
| 6,188,576 B1 | * | 2/2001 | Ali | G06K 19/077 |
| | | | | 174/17 R |
| 6,233,150 B1 | | 5/2001 | Lin et al. | 361/704 |
| 6,236,573 B1 | | 5/2001 | Gundlach et al. | 361/801 |
| 6,269,001 B1 | | 7/2001 | Matteson et al. | 361/695 |
| 6,305,964 B1 | * | 10/2001 | Pon | H05K 7/1431 |
| | | | | 439/327 |
| 6,313,995 B1 | | 11/2001 | Koide et al. | 361/705 |
| 6,319,037 B1 | * | 11/2001 | Lai | H01R 12/7005 |
| | | | | 361/801 |
| 6,331,940 B1 | | 12/2001 | Lin | 361/785 |
| 6,370,036 B1 | * | 4/2002 | Boe | H05K 7/1431 |
| | | | | 24/563 |
| 6,377,460 B1 | * | 4/2002 | Pohl | H01L 23/3677 |
| | | | | 165/80.3 |
| 6,449,156 B1 | | 9/2002 | Han et al. | 361/704 |
| 6,517,369 B1 | * | 2/2003 | Butterbaugh | H01R 12/707 |
| | | | | 439/327 |
| 6,545,877 B1 | | 4/2003 | Agha et al. | 361/801 |
| 6,589,059 B2 | * | 7/2003 | Perino | H01R 12/7005 |
| | | | | 439/331 |
| 6,921,272 B2 | | 7/2005 | Corbin et al. | 439/73 |
| 7,023,700 B2 | | 4/2006 | Chiou et al. | 361/704 |
| 7,215,551 B2 | | 5/2007 | Wang et al. | 361/707 |
| 7,233,501 B1 | | 6/2007 | Ingalz | 361/760 |
| 7,239,516 B2 | | 7/2007 | Long et al. | 361/704 |
| 7,257,002 B2 | | 8/2007 | Nagahashi | 361/704 |
| 7,345,882 B2 | | 3/2008 | Lee et al. | 361/710 |
| 7,349,219 B2 | | 3/2008 | Lai et al. | 361/719 |
| 7,349,220 B2 | | 3/2008 | Lai et al. | 361/719 |
| 7,382,617 B2 | | 6/2008 | Yu et al. | 361/704 |
| 7,391,613 B2 | | 6/2008 | Lai et al. | 361/700 |
| 7,397,664 B2 | | 7/2008 | Ankireddi | 361/710 |
| 7,400,506 B2 | | 7/2008 | Hoss et al. | 361/715 |
| 7,443,023 B2 | | 10/2008 | Wehrly et al. | 257/707 |
| 7,457,122 B2 | | 11/2008 | Lai et al. | 361/704 |
| 7,480,147 B2 | | 1/2009 | Hoss et al. | 361/721 |
| 7,600,557 B2 | * | 10/2009 | Chiang | H01L 23/40 |
| | | | | 165/80.2 |
| 7,609,523 B1 | | 10/2009 | Ni et al. | 361/715 |
| 7,649,742 B2 | * | 1/2010 | Ni | H05K 5/0269 |
| | | | | 174/520 |
| 7,654,840 B1 | * | 2/2010 | Zapata | H01R 13/62988 |
| | | | | 361/679.54 |
| 7,755,897 B2 | | 7/2010 | Chen et al. | 361/707 |
| 7,768,785 B2 | | 8/2010 | Ni et al. | 361/715 |
| 7,911,798 B2 | | 3/2011 | Chang et al. | 361/719 |
| 7,957,134 B2 | | 6/2011 | Farnsworth et al. | 361/679.54 |
| 8,059,403 B2 | | 11/2011 | Chou et al. | 361/695 |
| 8,096,812 B2 | * | 1/2012 | Perino | H05K 7/1431 |
| | | | | 439/331 |
| 8,154,873 B2 | | 4/2012 | Lian et al. | 361/715 |
| 2002/0039282 A1 | | 4/2002 | Han et al. | 361/719 |
| 2003/0026076 A1 | | 2/2003 | Wei | 361/704 |
| 2004/0130873 A1 | | 7/2004 | Hsueh | 361/697 |
| 2004/0250989 A1 | | 12/2004 | Im et al. | 165/80.1 |
| 2005/0141199 A1 | | 6/2005 | Chiou et al. | 361/704 |
| 2005/0276021 A1 | | 12/2005 | Gates et al. | 361/709 |
| 2006/0056154 A1 | | 3/2006 | Foster et al. | 361/700 |
| 2006/0203454 A1 | | 9/2006 | Chang | 361/707 |
| 2006/0268523 A1 | | 11/2006 | Lin | 361/710 |
| 2007/0195489 A1 | | 8/2007 | Lai et al. | 361/600 |
| 2007/0223198 A1 | | 9/2007 | Lai et al. | 361/720 |
| 2007/0263360 A1 | | 11/2007 | Lai et al. | 361/719 |
| 2008/0013282 A1 | | 1/2008 | Hoss et al. | 361/715 |
| 2008/0013286 A1 | | 1/2008 | Aoki et al. | 361/719 |
| 2008/0074848 A1 | | 3/2008 | Park et al. | 361/718 |
| 2008/0101036 A1 | | 5/2008 | Chen | 361/710 |
| 2009/0129026 A1 | | 5/2009 | Baek et al. | 361/710 |

\* cited by examiner

SYSTEM TO IMPROVE AN IN-LINE MEMORY MODULE

CROSS-REFERENCE TO RELATED APPLICATIONS

This application is a divisional application claiming priority under 35 U.S.C. §121 to U.S. patent application Ser. No. 13/452,848 filed Apr. 21, 2012, which claims priority to U.S. patent application Ser. No. 12/566,591 filed Sep. 24, 2009, now U.S. Pat. No. 8,248,805 issued Aug. 21, 2012, the entire text of which is specifically incorporated by reference herein.

BACKGROUND OF THE INVENTION

Field of the Invention

The invention relates to the field of computer systems, and, more particularly, to systems to improve an in-line memory module.

Description of Background

Generally, an in-line memory module is a printed circuit board that may carry random access memory ("RAM"), application-specific integrated circuits ("ASIC"), surface mount components ("SMC"), electrical contacts, and/or the like. The in-line memory module usually plugs into another printed circuit board carrying additional electronic components.

A heat spreader is a component that may efficiently transfer heat from one area to another area. The heat spreader usually has high thermal conductivity.

SUMMARY OF THE INVENTION

According to one embodiment of the invention, a system to improve an in-line memory module may include an edging carried by the in-line memory module to stiffen, support, protect, and/or aid in handling the in-line memory module. The system may also include a guide rib carried by the edging to facilitate positioning of the in-line memory module during installation.

The edging may include a low profile design to reduce air flow impedance. The edging may also include flares that control the in-line memory module's installation. The edging may further include a mounting feature to join the edging to the in-line memory module.

The edging may include a mounting guidance element to align the edging during joining to the in-line memory module. The edging may also include a retention feature which secures the in-line memory module after its installation. The in-line memory module may include a random access memory, application-specific integrated circuit, surface mount components, and/or heat sink.

In one embodiment, the system includes a heat spreader to aid in cooling a plurality of heat sources carried by the in-line memory module. The system may further include a compliant member to regulate the heat spreader's positioning relative to the plurality of heat sources.

The heat spreader may be shaped to contact the plurality of heat sources and to avoid a plurality of non-heat sources. The heat spreader may also include fins, and relief sections without fins that mate with the compliant member. The relief sections without fins may position the compliant member during installation. The relief sections without fins may facilitate tighter pitch between the in-line memory module and another in-line memory module.

The system may also include a fastener to connect the compliant member and the heat spreader. The fastener may control the compliant member's ability to regulate positioning. The fastener may engage a mating surface on the compliant member. The biasing member may provide substantially continuous mechanical loading across the heat spreader.

The heat spreader may include a plurality of heat spreaders, and the compliant member may include a plurality of compliant members. One of the plurality of compliant members may regulate one of the plurality of heat spreaders on one side of the in-line memory module, and another one of the plurality of compliant members may regulate another one of the plurality of heat spreaders on the other side of the in-line memory module. The system may also include a fastener to secure both compliant members and both heat spreaders.

In one embodiment, the system may include an edging carried by the in-line memory module to stiffen, support, protect, and/or aid in handling the in-line memory module. The system may also include guide ribs carried by the edging to facilitate positioning of the in-line memory module during installation. The system may further include a heat spreader to aid in cooling a plurality of heat sources carried by the in-line memory module. The system may additionally include a compliant member to regulate the heat spreader's positioning relative to the plurality of heat sources.

DETAILED DESCRIPTION OF THE INVENTION

The invention will now be described more fully hereinafter with reference to the accompanying drawings, in which preferred embodiments of the invention are shown. Like numbers refer to like elements throughout, like numbers with letter suffixes are used to identify similar parts in a single embodiment, letter suffix lower case n indicates any unused letter, and prime notations are used to indicate similar elements in alternative embodiments.

Figure 1:
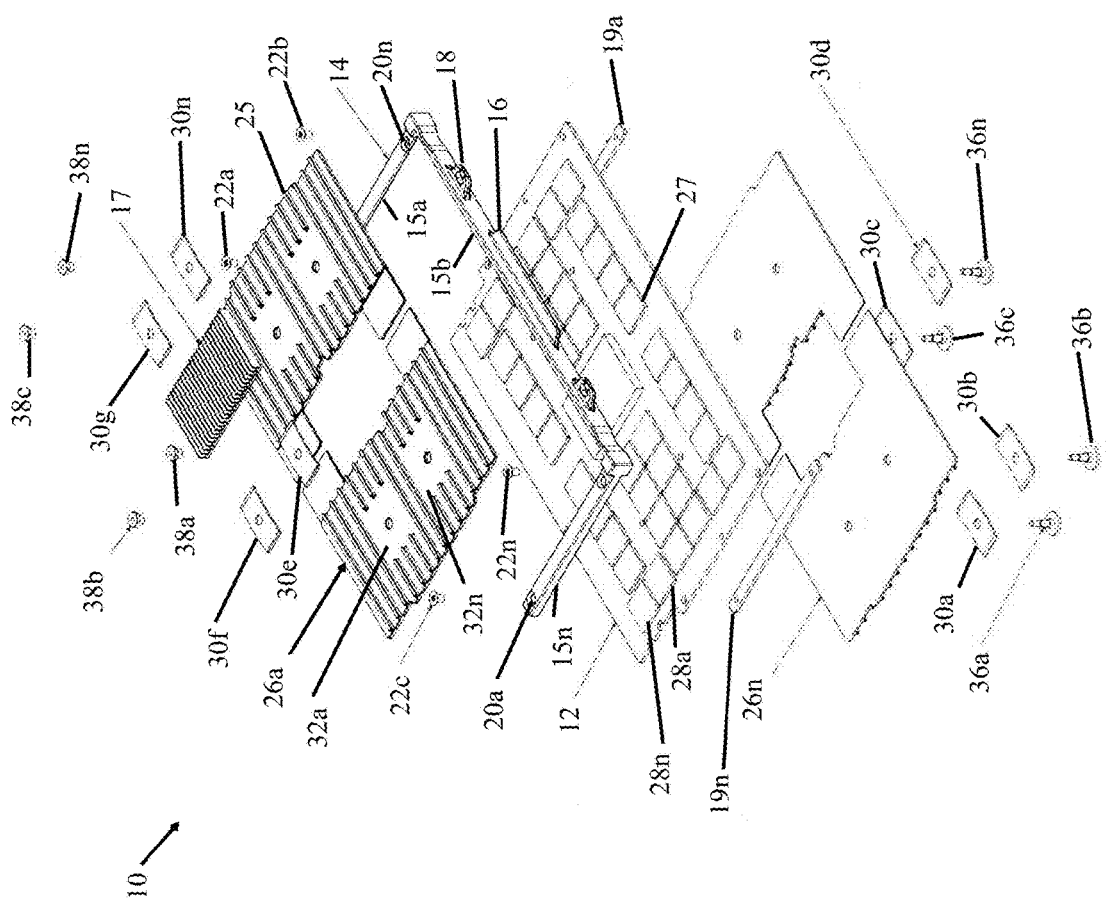
FIG. 1 is an exploded view diagram of a system to improve an in-line memory module in accordance with the invention.
Figure 2:
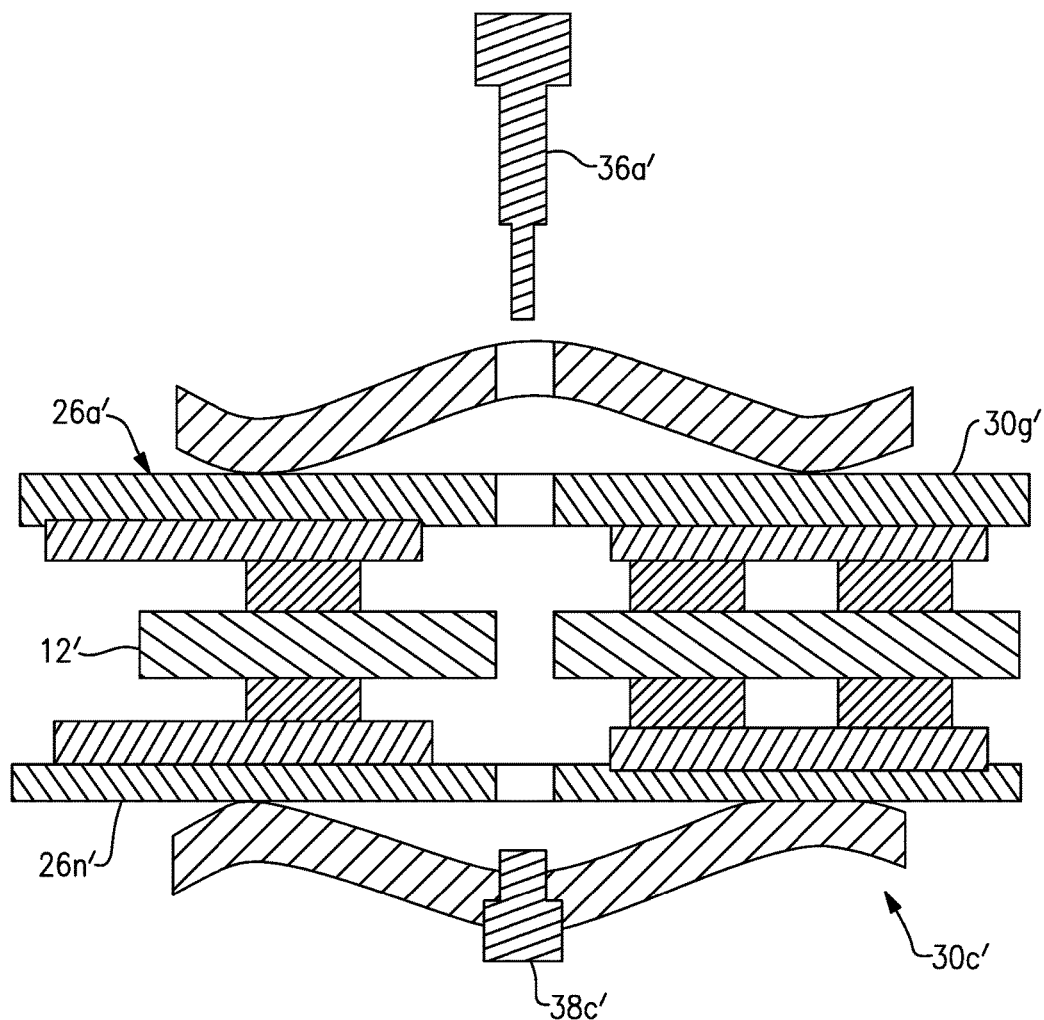
FIG. 2 is a side view diagram of another embodiment of a system to improve an in-line memory module in accordance with the invention.

With reference now to FIGS. 1 and 2, a system 10 to improve an in-line memory module 12 is initially described. According to one embodiment of the invention, the system 10 includes an edging 14 carried by the in-line memory module 12 to stiffen, support, protect, and/or aid in handling the in-line memory module. For example, the edging 14 stiffens across the major and/or minor axis of the in-line memory module 12. For instance, the edging 14 reduces buckling of the in-line memory module 12 during mating to its card edge connector, e.g. during integration to its next higher-level of assembly.

In another embodiment, the edging 14 comprises portions 15a-15n that are adjacent the major and/or minor axis of the in-line memory module 12. In one embodiment, the portions 15a-15n are adjacent three sides of the in-line memory module 12 thereby providing protection to much of the outer perimeter of the in-line memory module. In addition, such aids in handling of the in-line memory module 12 by providing the robust surfaces of the edging 14 for installation contact rather than the surfaces of the in-line memory module 12. In another embodiment, the edging 14 provides support during system-level fragility/mobility exposure.

In one embodiment, the system 10 includes a guide rib 16 carried by the edging 14 to interact with a card-edge connector system (not shown) to facilitate positioning of the in-line memory module 12 during installation. In another embodiment, the edging 14 includes a low profile design to reduce air flow impedance.

In one embodiment, the edging 14 includes flares 18 that control the in-line memory module's installation. For instance, the flares 18 are sized and/or shaped to mate with a system-level comb assembly (not shown) for ease of integration to the next higher-level assembly (not shown).

In one embodiment, the edging 14 includes a mounting feature 20a-20n to join the edging to the in-line memory module 12. For example, the mounting feature 20a-20n comprises holes through which a fastener passes, and together the hole/fastener are used to join the edging 14 to the in-line memory module 12. In another embodiment, a retention bar 19a-19n is used in conjunction with a respective mounting feature 20a-20n to join the edging 14 to the in-line memory module 12.

In one embodiment, the edging 14 includes a mounting guidance element 22a-22n to align the edging during joining to the in-line memory module 12. For instance, the mounting guidance element 22a-22n comprises locator dowels which align the edging 14 with the in-line memory module 12.

Figure 3:
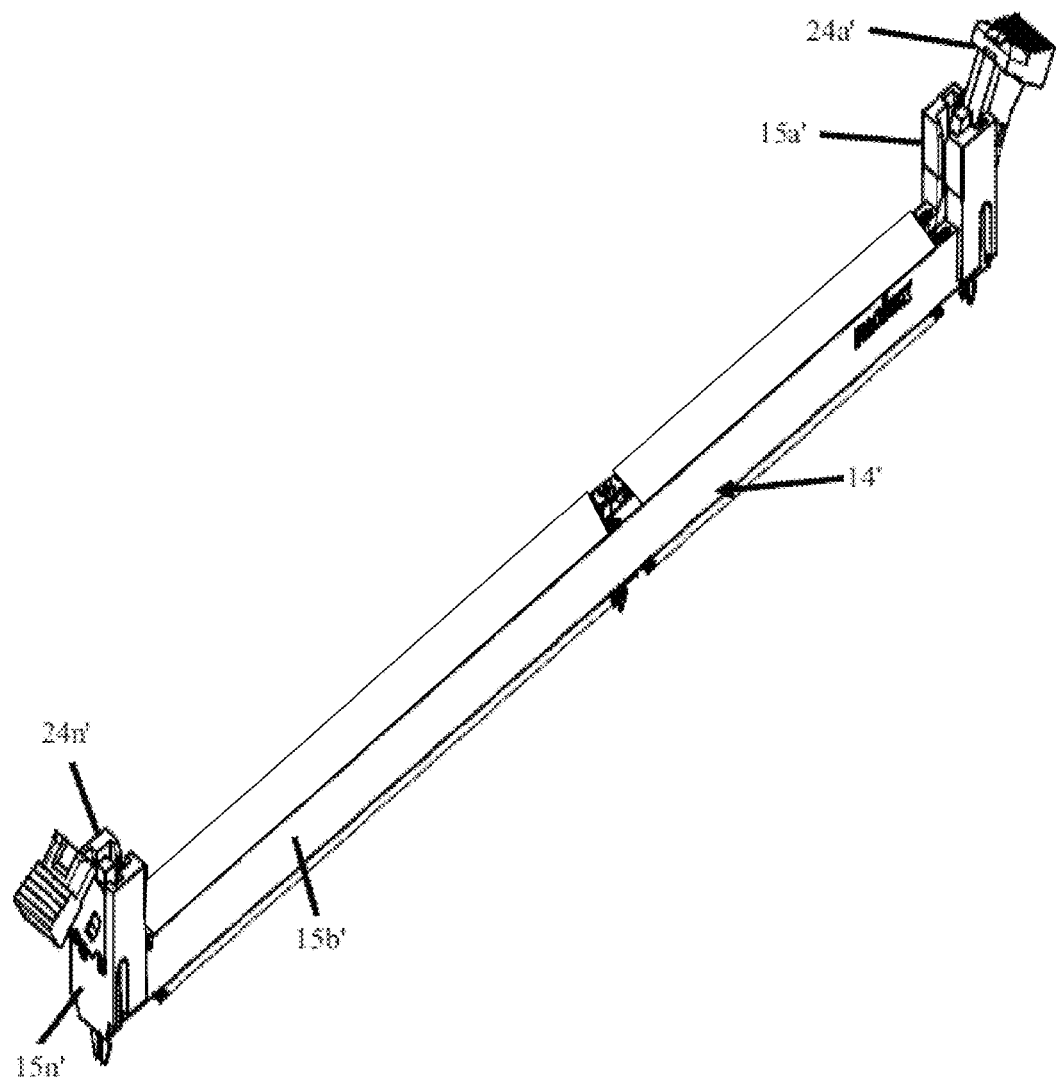
FIG. 3 is a top view illustrating the retainer in accordance with the invention.

With additional reference to FIG. 3, in another embodiment, the edging 14 includes a retainer 24 that secures the in-line memory module 12 after its installation. For example, the retainer 24 comprises a latching mechanism that engages the in-line memory module 12 in a locking manner. In one embodiment, the in-line memory module 12 includes a random access memory, application-specific integrated circuit, surface mount components, and/or heat sink 17.

In another embodiment, the system 10 includes a heat spreader 26a-26n to aid in cooling a plurality of heat sources 28a-28n carried by the in-line memory module 12. For instance, the plurality of heat sources 28a-28n comprises random access memory, application-specific integrated circuits, surface mount components, and/or the like.

In one embodiment, the system 10 includes a compliant member 30a-30n to regulate a respective heat spreader's 26a-26n positioning relative to the plurality of heat sources 28a-28n. For example, the compliant member 30a-30n comprises a spring washer. In another embodiment, the compliant member 30a-30n is substantially round and/or has sections removed to produce a series of arms in spaced relations.

In one embodiment, each heat spreader 26a-26n is shaped to contact a portion of the plurality of heat sources 28a-28n and to avoid a plurality of non-heat sources 27, e.g. other components carried by the in-line memory module 12. In another embodiment, the heat spreader 26a-26n includes fins 25, e.g. cooling fins. In one embodiment, the system 10 optimizes fin 25 count to balance surface area to air-flow resistance versus heat spreader 26a-26n structural deflection. In another embodiment, the heat spreader 26a-26n includes respective relief sections without fins 32a-32n that mate with a respective compliant member 30a-30n. In one embodiment, the heat spreader 26a-26n comprises a repeating design configuration, e.g. the same shape is used two times or more, on the in-line memory module 12.

Figure 4:
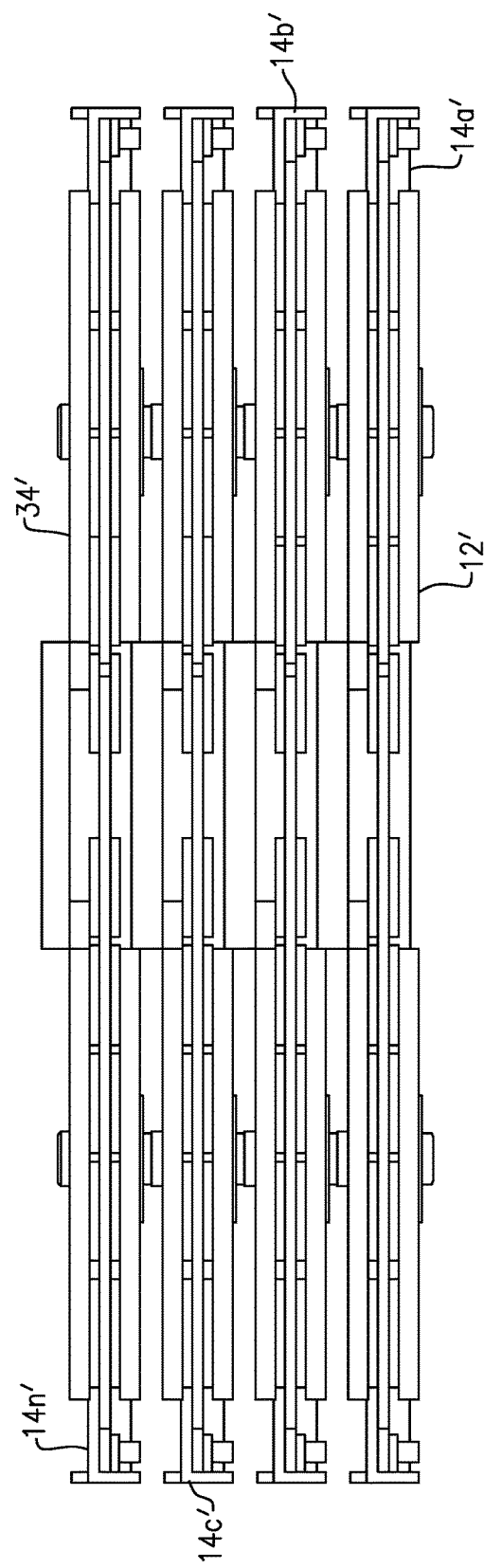
FIG. 4 is a side view diagram of a stack embodiment of a system to improve an in-line memory module in accordance with the invention.

With additional reference to FIG. 4, in one embodiment, the relief sections without fins 32a-32n position a respective compliant member 30a-30n during installation. In another embodiment, the relief sections without fins 32a-32n facilitate tighter pitch between the in-line memory module 12 and another in-line memory module 34. In one embodiment, the relief sections without fins 32a-32n limits each respective compliant member 30a-30n during the assembly of the system 10.

In one embodiment, the system 10 includes a fastener 36a-36n to connect a respective compliant member 30a-30n and a respective heat spreader 26a-26n. For example, the fastener 36a-36n comprises a screw and/or the like. In another embodiment, the fastener 36a-36n controls a respective compliant member's 30a-30n ability to regulate positioning, e.g. by setting the load delivered by the compliant member.

In one embodiment, the fastener 36a-36n engages a respective mating surface 38a-38n, e.g. a threaded nut, fixed on a respective compliant member 30a-30n. In another embodiment, each mating surface 38a-38n is a standalone threaded nut. In one embodiment, the biasing member 30a-30n provides substantially continuous mechanical loading across a respective heat spreader 26a-26n.

In one embodiment, one of the plurality of compliant members 30a-30n regulates one of the plurality of heat spreaders 26a-26n on one side of the in-line memory module 12, and another one of the plurality of compliant members regulates another one of the plurality of heat spreaders on the other side of the in-line memory module. In one embodiment, the system 10 includes a single fastener 36a-36n to secure both compliant members 30a-30n and both heat spreaders 26a-26n in the preceding embodiment.

In one embodiment, the system 10 includes an edging 14 carried by the in-line memory module 12 to stiffen, support, protect, and/or aid in handling the in-line memory module. The system 10 also includes a guide rib 16 carried by the edging 14 to facilitate positioning of the in-line memory module 12 during installation. The system 10 further include a heat spreader 26a-26n to aid in cooling a plurality of heat sources 28a-28n carried by the in-line memory module 12. The system 10 additionally includes a compliant member 30a-30n to regulate a respective heat spreader's 26a-26n positioning relative to a respective plurality of heat sources 28a-28n.

In view of the foregoing, the system 10 provides a mechanical and/or thermal package for the in-line memory module 12, for example. In one embodiment, the system 10 provides a low-profile solution to reduce impedance to air-flow around the in-line memory module 12. In another embodiment, the system 10 provides the ability to establish an "interleaved" design to flatten the in-line memory module 12 to reduce adverse card bowing effects relative to its mating connector.

In one embodiment, the system 10 applies sufficient load in a substantially uniform manner across the heat spreader 26a-26n to ensure adequate thermal interface material ("TIM") coverage and thickness resides across substantially all plurality of heat source 28a-28n sites. In another embodiment, the system 10 substantially fills TIM gaps, both large and small, without unique or customized hardware for each of the plurality of heat sources 28a-28n. In one embodiment, the system 10 provides substantially continuous mechanical loading with varying TIM properties, e.g. pre- and post-reflow of phase change materials. In one embodiment, the TIM comprises thermal grease, silicone gels, curable materials, and/or the like.

In another embodiment, the system 10 is completed by adding the edging 14 and the heat spreaders 26a-26n with applied TIM. In one embodiment, when applying a phase change TIM, final assembly is completed when the in-line memory module 12 is heated, thereby allowing the material to reflow. Subsequent to this action, the compliant members 30a-30n provide a substantially continuous load on the heat spreaders 26a-26n during follow-on thermal excursions.

In one embodiment, the system 10 limits buckling of the in-line memory module 12 during system-level mating to its card-edge connector, thereby minimizing potential damaging strains/stresses to the in-line memory module's 12 RAMs, ASIC(s), and other surface mount components, e.g. resistors, capacitors, power regulators, and/or the like. In another embodiment, the system 10 provides a means to guide and integrate the in-line memory module 12 to the system-level package. In one embodiment, the system 10 provides a reliable thermal solution that spans across a plurality of RAM sites while addressing in-plane variations associated with overall RAM soldered height co-planarity, in-line memory module 12 card flatness, and/or RAM heat spreader 26 flatness and deflection.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
    an in-line memory module including a printed circuit board and a plurality of heat sources, the printed circuit board including a plurality of through holes;
    an edging carried by the in-line memory module along three edges of the in-line memory module, the edging including mounting features at opposing sides of the edging, the mounting features positioned to join the edging to the in-line memory module at the through holes, the edging configured to at least one of stiffen, support, protect, and aid in handling the in-line memory module;
    retention bars secured to the in-line memory module at the through holes;
    locator dowels aligning the edging and the retention bars with the in-line memory module at the through holes such that the retention bars are secured to a back surface of the in-line memory module and the edging is secured to a front surface of in-line memory module opposite the back surface; and
    a guide rib carried by said edging to facilitate positioning of the in-line memory module during installation.

2. The system of claim 1 wherein said edging comprises a low profile design to reduce air flow impedance.

3. The system of claim 1 wherein said edging comprises flares that control the in-line memory module's installation.

4. The system of claim 1 wherein said edging comprises a mounting feature to join said edging to the in-line memory module.

5. The system of claim 1 wherein said edging comprises a mounting guidance element to align said edging during joining to the in-line memory module.

6. The system of claim 1 wherein said edging comprises a retainer that secures the in-line memory module after its installation.

7. The system of claim 1 wherein the in-line memory module comprises at least one of random access memory, application-specific integrated circuit, surface mount components, and heat sink.

* * * * *